US010545810B2

(12) United States Patent
Barndt et al.

(10) Patent No.: US 10,545,810 B2
(45) Date of Patent: Jan. 28, 2020

(54) METHOD AND APPARATUS FOR MONITORING NON-VOLATILE MEMORY READ ERRORS USING BACKGROUND MEDIA SCAN

(71) Applicant: Western Digital Technologies, Inc., Irvine, CA (US)

(72) Inventors: Richard David Barndt, San Diego, CA (US); Hung-min Chang, Irvine, CA (US); Aldo Giovanni Cometti, San Diego, CA (US); Jerry Lo, Hacienda Heights, CA (US); Hung-Cheng Yeh, Irvine, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 302 days.

(21) Appl. No.: 15/388,603

(22) Filed: Dec. 22, 2016

(65) Prior Publication Data

US 2018/0181300 A1 Jun. 28, 2018

(51) Int. Cl.
*G06F 11/07* (2006.01)
*G11C 16/34* (2006.01)
*G11C 29/52* (2006.01)
*G06F 3/06* (2006.01)

(52) U.S. Cl.
CPC ........ *G06F 11/079* (2013.01); *G11C 16/3436* (2013.01); *G11C 29/52* (2013.01); *G06F 3/0619* (2013.01); *G06F 2212/7205* (2013.01); *G06F 2212/7209* (2013.01); *G11C 16/3422* (2013.01)

(58) Field of Classification Search
CPC .... G06F 11/00; G06F 11/079; G06F 11/0727; G06F 11/0751; G06F 3/0614; G06F 3/0619; G06F 2212/7209; G06F 11/1048; G06F 2212/72; G06F 2212/7205; G11C 16/3422; G11C 16/349; G11C 16/3436; G11C 16/3454; G11C 16/344; G11C 16/3459; G11C 29/56; G11C 29/52; G11C 16/102; G11C 29/00
See application file for complete search history.

(56) References Cited

U.S. PATENT DOCUMENTS

| | | | | |
|---|---|---|---|---|
| 5,097,446 A | * | 3/1992 | Shoji | G11C 16/32 365/185.11 |
| 2008/0239851 A1 | * | 10/2008 | Lin | G11C 16/3418 365/222 |
| 2009/0055697 A1 | * | 2/2009 | Radke | G06F 11/006 714/727 |
| 2010/0165689 A1 | * | 7/2010 | Rotbard | G11C 11/56 365/45 |
| 2013/0346805 A1 | * | 12/2013 | Sprouse | G11C 16/3418 714/42 |
| 2016/0077903 A1 | * | 3/2016 | Reddy | G11C 16/349 714/704 |

(Continued)

*Primary Examiner* — Joseph O Schell
(74) *Attorney, Agent, or Firm* — Loza & Loza, LLP; Gabriel Fitch

(57) ABSTRACT

Aspects of the disclosure provide a method and an apparatus that perform a background media scan (BGMS) with improved efficiency. In particular, the disclosed BGMS processes can monitor data retention performance of a large capacity solid state drive (SSD) without significantly increasing scanning overhead by scanning only some sample pages of a memory block.

17 Claims, 9 Drawing Sheets

(56) References Cited

U.S. PATENT DOCUMENTS

2017/0147209 A1* 5/2017 Lee .................. G06F 3/064
2017/0206131 A1* 7/2017 Christensen ........ G06F 11/1072
2018/0074701 A1* 3/2018 Chang ................ G06F 3/0616

* cited by examiner

METHOD AND APPARATUS FOR MONITORING NON-VOLATILE MEMORY READ ERRORS USING BACKGROUND MEDIA SCAN

FIELD

Aspects of the present disclosure generally relate to data storage devices, and more specifically, to monitoring of memory using a background media scan (BGMS).

BACKGROUND

In a variety of consumer electronics and computers, solid state drives incorporating non-volatile memories (NVMs) are frequently replacing or supplementing conventional rotating hard disk drives for mass storage. These non-volatile memories may include one or more flash memory devices, the flash memory devices may be logically divided into blocks, and each of the blocks may be further logically divided into addressable pages.

However, flash memory or the like are susceptible to data retention problems. Data retention is the ability of a memory cell or page to retain the stored data over a period of time in an unbiased state. Data retention time can be affected by various factors such as program/erase (P/E) cycles and operating temperature. In general, data retention time decreases as the number of P/E cycles increases. Operating the memory in elevated temperature for an extended period can also reduce data retention time.

SUMMARY

The following presents a simplified summary of one or more aspects of the present disclosure, in order to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in a simplified form as a prelude to the more detailed description that is presented later.

Aspects of the disclosure provide a method and an apparatus that perform a background media scan (BGMS) with improved efficiency. In particular, the disclosed BGMS processes can monitor data retention performance of a large capacity solid state drive (SSD) without significantly increasing scanning overhead by scanning only some sample pages of a memory block.

In one aspect of the disclosure, this disclosure relates to a method for a method of monitoring a non-volatile memory (NVM) using a background media scan (BGMS). The method performs the BGMS on a plurality of blocks of the NVM during a predetermined BGMS scan that scans a sample of pages included in each block of the plurality of blocks. The method further determines a read error among the sample of pages of a block of the plurality of blocks. When an error is found in a block, the method scans all pages of the block containing the read error.

In another aspect of the disclosure, this disclosure relates to a solid state drive (SSD) that includes a non-volatile memory (NVM) and a processor coupled to the NVM. The processor is configured to perform a background media scan (BGMS) on a plurality of blocks of the NVM during a predetermined BGMS scan period. The BGMS scans a sample of pages included in each block of the plurality of blocks. The processor is further configured to determine a read error among the sample of pages in a block of the plurality of blocks. If an error is found in a block, the processor is configured to scan all pages of the block containing the read error.

In another aspect of the disclosure, this disclosure relates to a solid state drive (SSD) comprising a non-volatile memory (NVM). The SSD further includes means for performing a background media scan (BGMS) on a plurality of blocks of the NVM during a predetermined BGMS scan period, and the BGMS scans a sample of pages included in each block of the plurality of blocks. The SSD further includes means for determining a read error among the sample of pages of a block of the plurality of blocks and means for scanning all pages of the block containing the read error.

DETAILED DESCRIPTION

Figure 1:
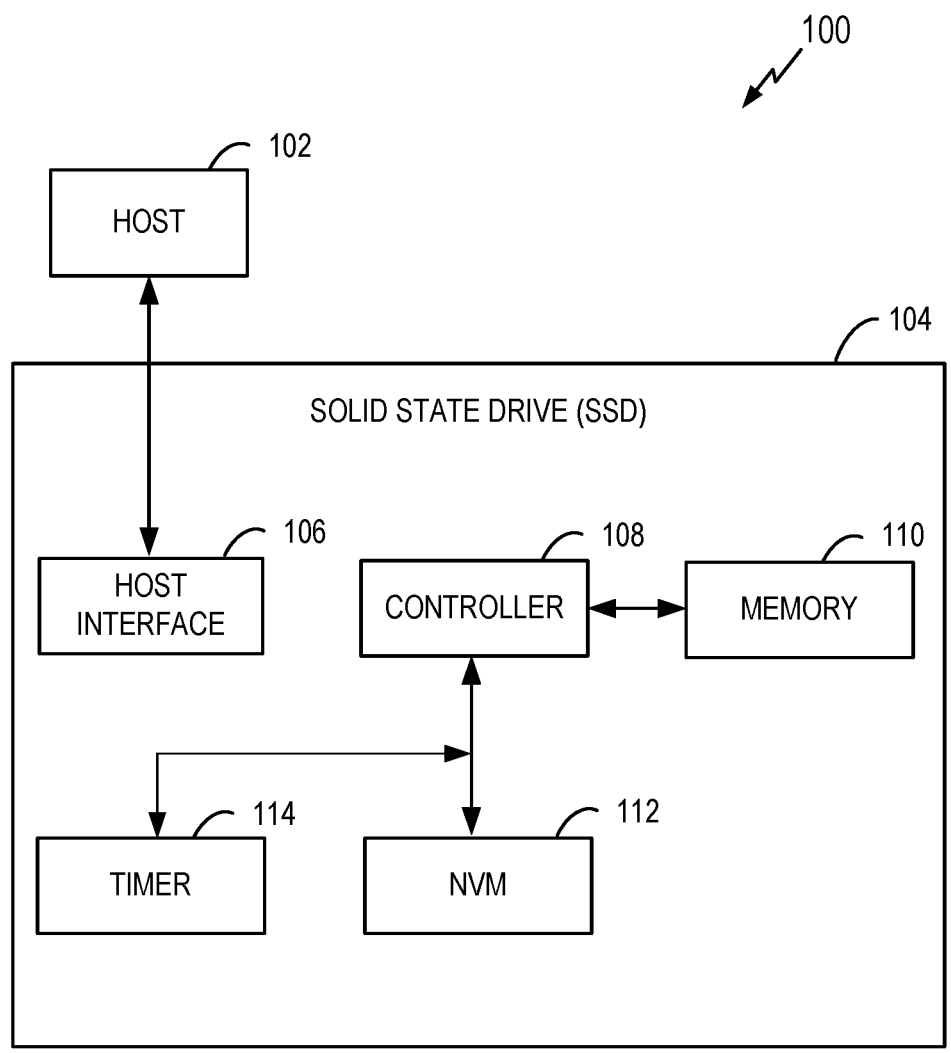
FIG. 1 is a block diagram of a solid state drive (SSD) that can perform various data retention monitoring functions using a background media scan (BGMS) in accordance with some embodiments of the disclosure.

Referring now to the drawings, systems, and methods of using a background media scan (BGMS) for monitoring data retention error of a data storage device or memory device are illustrated. While the BGMS is illustrated using a memory included in a solid state drive (SSD), the present disclosure is not limited as such, but may be extended to other data storage devices. The BGMS processes described in this disclosure can be used to monitor data retention performance of a large capacity SSD without significantly increasing scanning overhead. Moreover, the BGMS processes of the present disclosure can effectively monitor data retention error of a memory block by scanning only some sample pages of the block. The described BGMS processes can also discover and/or fix error locations on the SSD before the error locations are encountered by a host accessing the data storage memory of the SSD.

FIG. 1 is a block diagram of an SSD that is configured to perform various data retention monitoring functions using a BGMS in accordance with some embodiments of the disclosure. The system 100 includes a host 102 and an SSD 104 coupled to the host 102. The host 102 provides various commands or instructions to the SSD 104 for transferring data between the host 102 and the SSD 104. For example, the host 102 may provide a write command to the SSD 104 for writing data to the SSD 104 or read command to the SSD 104 for reading data from the SSD 104. The host 102 may be any system or device having a need for data storage or retrieval and a compatible interface for communicating with the SSD 104. For example, the host 102 may be a computing device, a personal computer, a portable computer, or workstation, a server, a personal digital assistant, a smartphone, a digital camera, a digital phone, or the like.

The SSD 104 includes a host interface 106, a controller 108, a memory 110, a non-volatile memory 112, and a timer 114. The host interface 106 is coupled to the controller 108 and facilitates communication between the host 102 and the controller 108. The SSD 104 may utilize the timer 114 for various functions including, for example, tracking the time when certain data is written to the NVM 112. Additionally, the controller 108 is coupled to the memory 110 and the non-volatile memory 112. The host interface 106 may be any type of communication interface, such as an Integrated Drive Electronics (IDE) interface, a Universal Serial Bus (USB) interface, a Serial Peripheral (SP) interface, an Advanced Technology Attachment (ATA) interface, a Small Computer System Interface (SCSI), an IEEE 1394 (Firewire) interface, or the like. In some embodiments, the host 102 includes the SSD 104. In other embodiments, the SSD 104 is remote with respect to the host 102 or is contained in a remote computing system coupled in communication with the host 102. For example, the host 102 may communicate with the SSD 104 through a wired and/or wireless communication link.

The controller 108 controls operation of the SSD 104. In various embodiments, the controller 108 receives commands from the host 102 through the host interface 106 and performs the commands to transfer data between the host 102 and the non-volatile memory 112. The controller 108 may include any type of processing device, such as a microprocessor, a microcontroller, an embedded controller, a logic circuit, software, firmware, a combination of the above devices, or the like, for controlling the operation of the SSD 104.

In some embodiments, some or all of the functions described herein as being performed by the controller 108 may instead be performed by another element of the SSD 104. In one aspect, the controller 108 can be a special purpose controller specifically configured/programmed to perform any of the functions contained within the application. For example, the SSD 104 may include a microprocessor, a microcontroller, an embedded controller, a logic circuit, a field-programmable gate array (FPGA), an application-specific integrated circuit (ASIC), software, firmware, or any kind of processing device, for performing one or more of the functions described herein as being performed by the controller 108. In some embodiments, one or more of the functions described herein as being performed by the controller 108 are instead performed by the host 102. In some embodiments, some or all of the functions described herein as being performed by the controller 108 may instead be performed by another element such as a controller in a hybrid drive including both non-volatile memory elements and magnetic storage elements.

The memory 110 may be any memory, computing device, or system capable of storing data. For example, the memory 110 may be a random-access memory (RAM), a dynamic random-access memory (DRAM), a static random-access memory (SRAM), a synchronous dynamic random-access memory (SDRAM), or the like. In various embodiments, the controller 108 uses the memory 110, or a portion thereof, to store data during the transfer of data between the host 102 and the non-volatile memory 112. For example, the memory 110 or a portion of the memory 110 may be a cache memory.

The non-volatile memory (NVM) 112 receives data from the controller 108 and stores the data. The non-volatile memory 112 may include one or more types of non-volatile data storages, such as a flash storage system, a solid state drive, a flash memory card, a secure digital (SD) card, a universal serial bus (USB) memory device, a CompactFlash card, a SmartMedia device, a flash storage array, a flash storage, an erasable programmable read-only-memory (EPROM), an electrically erasable programmable read-only-memory (EEPROM), magnetoresistive random-access memory, non-volatile RAM, ferroelectric RAM, or phase-change RAM, or the like.

In some applications, the NVM 112 may include flash memory that may be written and read in a plurality of blocks. One example of flash memory is the negative-AND (NAND) type flash memory that is commonly used in solid state storage devices and systems. The data storage of the NAND flash is organized in terms of blocks. Each block is divided into a certain number of pages that is the smallest unit that data can be written to the NAND flash. When a page is written with data, it is no longer available for storing new data unless it is first erased. To erase a particular page, the entire block that contains that page is erased. Flash memory can be written and read reliably for a finite number of program/erase (P/E) cycles. However, even before the P/E cycles limit is reached, data retention at the flash memory will deteriorate over time and affect the integrity and reliability of the stored data.

A background media scan (BGMS) may be used to monitor data retention errors at the flash memory so that certain actions may be taken proactively to prevent potential data lost and maintain data integrity. The BGMS also can protect the flash memory from potentially high data retention error caused by cells that are not or rarely read. When a memory cell is not read or rarely read for an extended period, the error level is unknown and therefore proactive measurements would not be performed to maintain data integrity.

Figure 2:
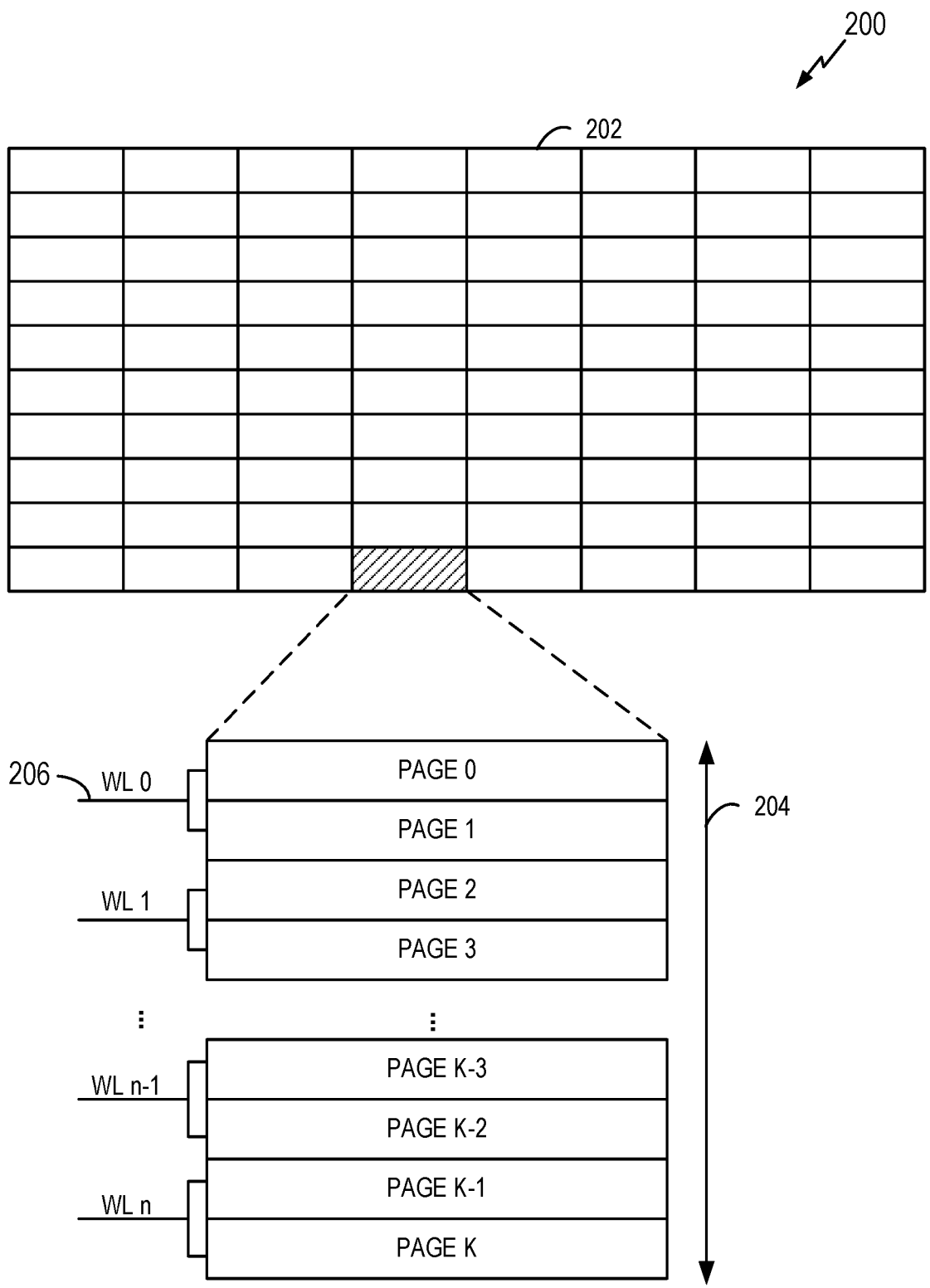
FIG. 2 is a block diagram illustrating a flash memory organization in accordance with one embodiment of the disclosure.

FIG. 2 is a block diagram illustrating a flash memory organization in accordance with one embodiment of the disclosure. A flash memory 200 may include a number of memory blocks 202 (hereinafter "blocks" in this disclosure). Each block 202 may include a number of pages 204 (e.g., K+1 pages in each block as shown in FIG. 2). Access to the pages 204 may be controlled via a number of wordlines 206 (e.g., $WL_0$ through $WL_n$ shown in FIG. 2). In one example, one wordline (WL) can control the access of two pages (upper page and a lower page). In this example, the upper page and lower page share the same cell using different threshold voltages, respectively. In other examples, one wordline may control the access to more than two pages. While FIG. 2 illustrates an exemplary memory organization of the flash memory 200, the present disclosure is not limited to this particular example. In other examples, the flash memory 200 may have other memory organizations.

The flash memory 200 may be included in the NVM 112 of the SSD 104. When a BGMS is performed on the flash memory (e.g., NVM 112), SSD performance will be affected because some cycle times are used for performing the BGMS. However, the BGMS needs to be performed with significant frequency to detect data retention problem before data integrity is compromised. For example, the BGMS may be performed at least once every twenty-four hours to check all of the pages in all of the blocks in the flash memory. However, as the size of the flash memory included in the SSD continues to increase, the time it takes to scan all of the pages will become a significant overhead that impacts the performance of the SSD 104. Although it is possible to lengthen the time interval between successive BGMSs, doing so may reduce the effectiveness of the BGMS to detect data retention errors.

Figure 3:
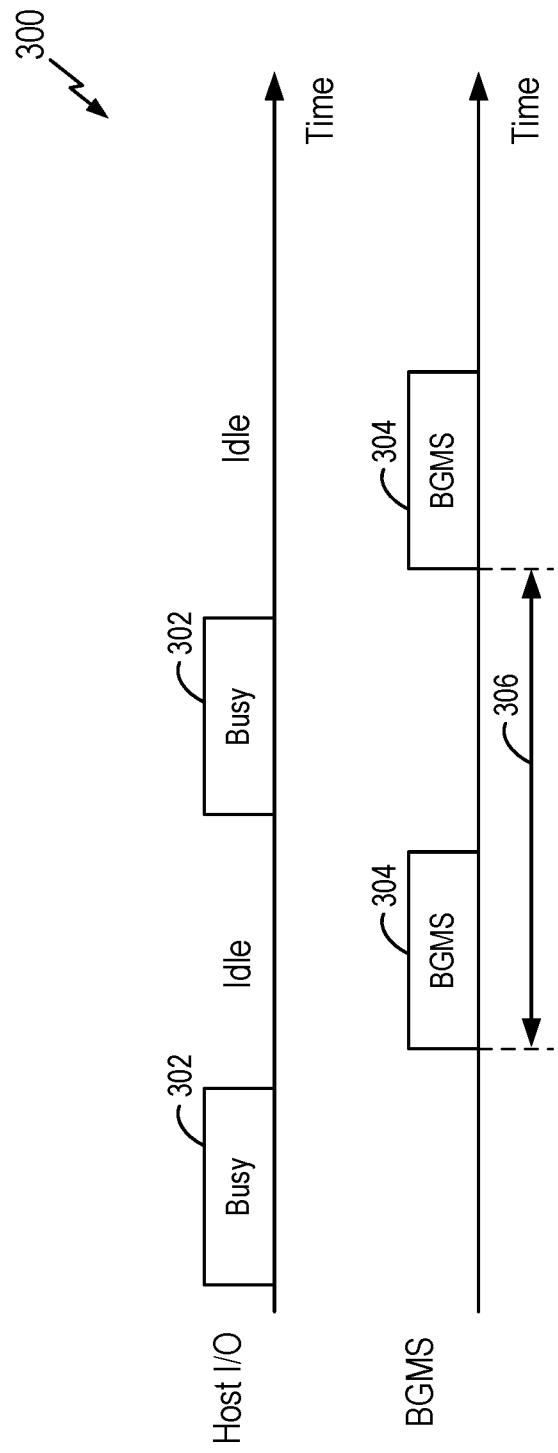
FIG. 3 is a diagram illustrating a timeline for performing a BGMS in accordance with one embodiment of the disclosure.

FIG. 3 is a diagram illustrating a timeline for performing a BGMS in accordance with an embodiment of the disclosure. In order to reduce impact to host input and output (I/O) performance, a BGMS may be performed while host I/O is idle or below a certain level. In FIG. 3, when host I/O 302 is active or busy, no BGMS is performed. When host I/O is idle or not active, the BGMS 304 may be performed during a BGMS scan period 306. The BGMS scan period 306 may be any predetermined time interval based on various criteria and needs. In one example, the BGMS scan period 306 may be twenty-four hours or less. In this example, at least one BGMS is performed in each BGMS scan period. When the number of pages of a flash memory block increases (for example when the storage density is increased), the time for completing one BGMS will increase if every page is scanned. Therefore, increasing flash memory size (i.e., more pages) may lead to a scenario where a BGMS may not be completed within a certain BGMS scan period, and it will increase overhead of the SSD significantly.

Figure 4:
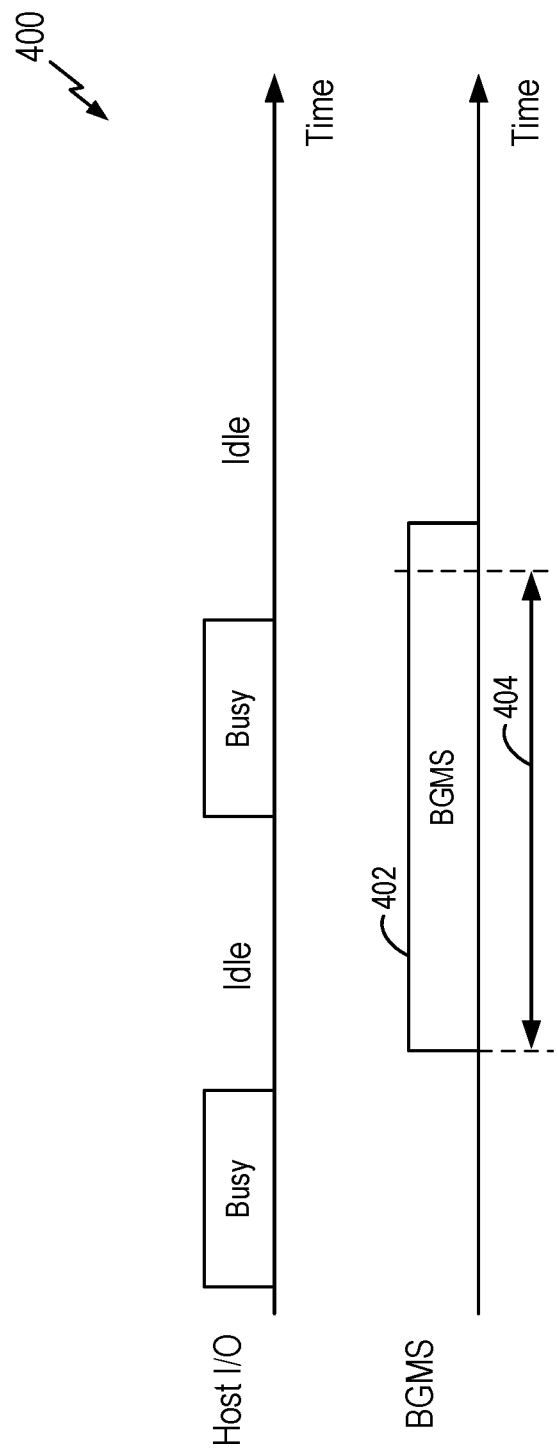
FIG. 4 is a diagram illustrating an example when a BGMS on a memory extends beyond a BGMS scan period.

FIG. 4 is a timing diagram illustrating an exemplary BGMS 402 on a flash memory extending beyond a BGMS scan period 404 due to a large number of pages contained in a block. If there are extra host I/O activities, the situation will get even worse because less time will be available for performing the BGMS.

In one embodiment of the disclosure, only some sample pages of a block are scanned using the BGMS instead of scanning every page such that significant performance impact to the SSD 104 may be avoided or reduced even when a block contains a large number of pages.

Figure 5:
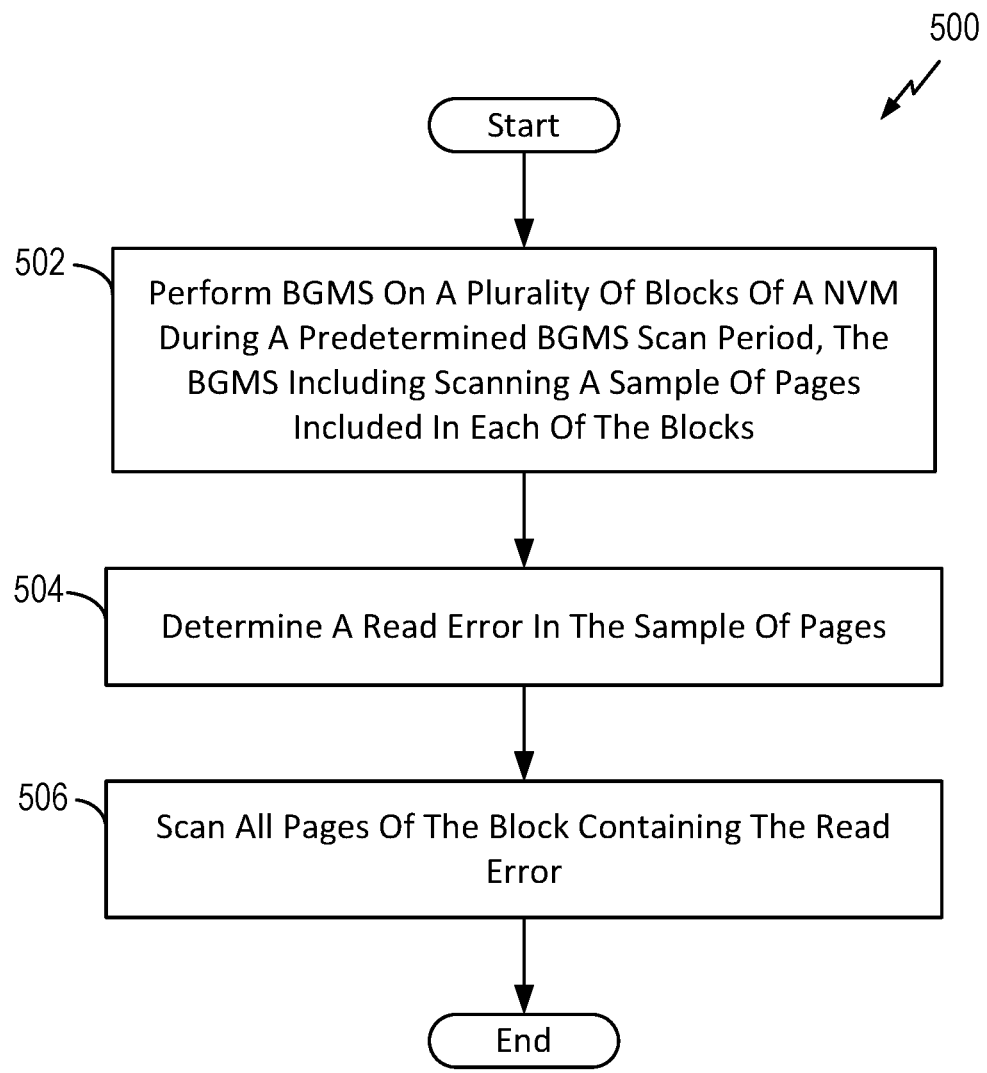
FIG. 5 is a flow chart illustrating a process for performing a BGMS to monitor data retention in accordance with one embodiment of the disclosure.

FIG. 5 is a flow chart illustrating a process 500 for performing a BGMS to monitor data retention of a memory in accordance with one embodiment of the disclosure. In this embodiment, at block 502, an SSD 104 may scan a plurality of memory blocks 202 at least once within a predetermined BGMS scan period. In one embodiment, the block 502 may be effectuated with the controller 108, or with the controller 108 in combination with the host 102 as illustrated in FIG. 1. The block 502 may represent one means for performing a BGMS on a plurality of blocks of the NVM during a predetermined BGMS scan period, the BGMS including scanning a sample of pages included in each block of the plurality of blocks. For example, the SSD 104 may scan a plurality of blocks 202 of the NVM 112 within a twenty-four hour period. In this embodiment, the SSD scans a sample of pages (i.e., not all pages) included in each of the blocks (e.g., a subset of all pages contained in a given block) such that scan time may be reduced.

At block 504, the SSD may determine a read error occurred in one or more of the scanned pages. The SSD may determine a read error in the sample pages. The read error may be indicative of a data retention error of the page with the read error. In one embodiment, the block 504 may be effectuated with the controller 108, or with the controller 108 in combination with the host 102 as illustrated in FIG. 1. The block 504 may represent one means for determining a read error among the sample of pages of a block of the plurality of blocks. If no error is detected, the SSD continues the BGMS by scanning only some sample pages in each block.

If error is detected, at block 506, the SSD scans all pages of the block containing the read error. That is, if the SSD determines that a read error is present in any of the scanned sample pages, the SSD scans all pages of that block with the page having the read error. In one embodiment, the block 506 may be effectuated with the controller 108, or with the controller 108 in combination with the host 102 as illustrated in FIG. 1. The block 506 may represent one means for scanning all pages of the block containing the read error.

Since the pages in a single memory block tend to have similar data retention error characteristics that are a function of the number of P/E cycles and data retention time on that block, it may not be necessary to scan the entire block to achieve a high level of confidence in detecting critically high levels of data retention errors in the block. Instead, scanning a limited number of pages (e.g., sample pages) may be sufficient to monitor a block as illustrated in FIG. 5. When a sample page scan results in a certain quality metric threshold being exceeded (e.g., more errors encountered than an acceptable threshold), a full scan of all pages in the block may be performed. In one example, an enhanced BGMS (such as the process shown in FIG. 5) can effectively monitor a block by scanning only about 10 percent of the pages in the block. Such an enhanced BGMS may be used to monitor very large capacity SSDs without introducing undue overhead.

Figure 6:
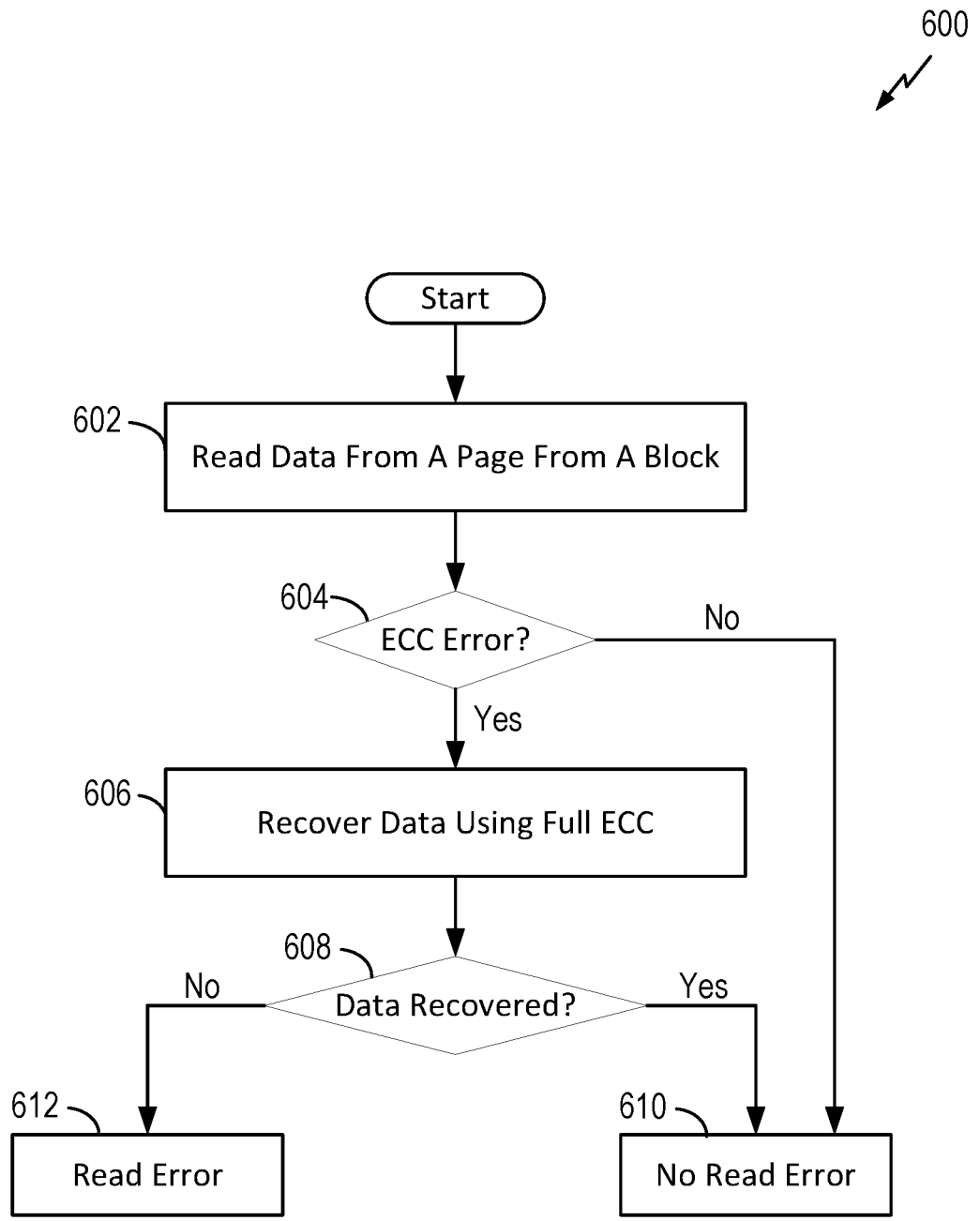
FIG. 6 is a flow chart illustrating a process for determining a read error of a memory in accordance with one embodiment of the disclosure.

FIG. 6 is a flow chart illustrating a process 600 for determining a read error of a memory in accordance with an embodiment of the disclosure. This process 600 may be performed by the SSD 104 to determine a read error of its NVM 112 while performing a BGMS according to the process 500 of FIG. 5. At block 602, the SSD reads data from a page of a memory block 200. At decision block 604, the SSD determines whether the page has an error-correcting code (ECC) error. For example, the SSD may determine a read error using a slightly reduced ECC tolerance so that the SSD can determine that the page may have data retention problems but is still readable by the host. At block 606, if it is determined that the page has an ECC error, the SSD may attempt to recover the data with full ECC. In some examples, the SSD may attempt to rewrite data to the same spot, and verify that it can re-read the data without error. At decision block 608, if the data is recovered, the SSD may determine that the page has no data retention error (no read error) at block 610; otherwise, the SSD may determine that the page has data retention error (read error) at block 612. In some examples, the SSD may mark the data as needing reallocation and avoid writing data to this page location in the future.

Figure 7:
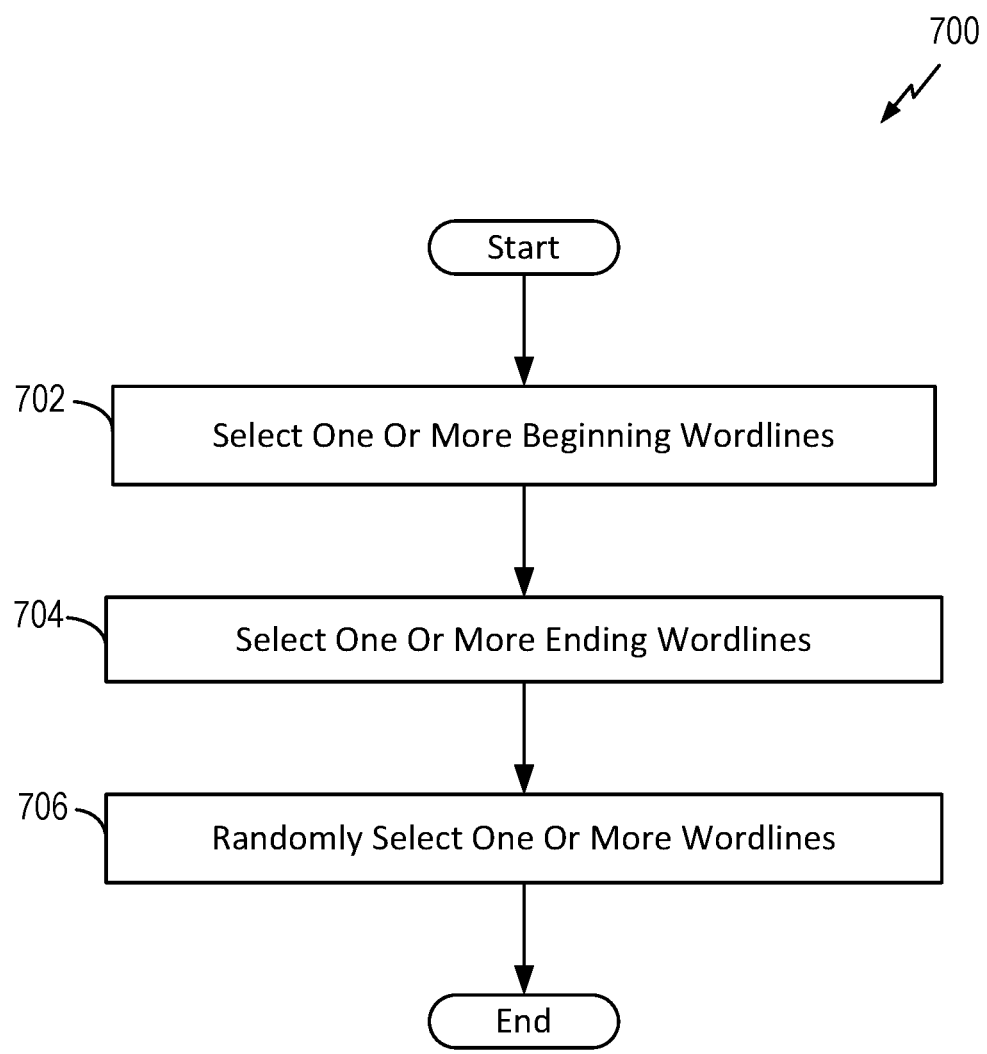
FIG. 7 is a flow chart illustrating a process for selecting some page samples of a memory block during a BGMS in accordance with one embodiment of the disclosure.

FIG. 7 is a flow chart illustrating a process 700 for selecting some sample pages of a memory block when performing a BGMS in accordance with an embodiment of the disclosure. The pages that are sampled may be selected based on a combination of predetermined wordlines as well as randomly selected wordlines that can be changed in each BGMS iteration. At block 702, the SSD 104 may select one or more predetermined beginning wordlines of a memory block. Each beginning wordline controls access to one or more pages of the block. A beginning wordline may refer to a wordline that is the first wordline of a block in relation to a physical or logical layout of the block. In one example, the first two beginning wordlines (e.g., $WL_0$ and $WL_1$ of FIG. 2) may be selected. The numbering of the wordlines and corresponding pages may be different in other embodiments, and are not limited to those shown in FIG. 2.

At block 704, the SSD may select one or more ending wordlines of the block. In one example, the last two ending wordlines (e.g., $WL_{n-1}$ and $WL_n$ of FIG. 2) may be selected. Each ending wordline controls access to one or more pages of the memory. An ending wordline may refer to a wordline that is the last wordline of a memory in relation to a physical or logical layout of the block. Therefore, the first beginning wordline (e.g., $WL_0$) and the last ending wordline (e.g., $WL_n$) may be the respective outermost wordlines of the block in a physical or logical sense.

At block 706, the SSD may randomly select wordlines between the selected beginning wordline(s) and ending wordline(s). In one example, two such wordlines may be randomly selected each time a BGMS is performed. In some examples, different wordlines are randomly rotated between the beginning wordlines and ending wordlines in each BGMS. Therefore, all wordlines between the beginning wordlines and ending wordlines will get a chance to be scanned in a random fashion. In one embodiment of the disclosure, the SSD may scan only one of the pages (e.g., an upper page) control by the selected wordline. In one example, referring to FIG. 2, the SSD may scan only page 1 for $WL_0$ and only page 3 for $WL_1$. Scanning only one page per wordline may be sufficient because in certain flash memory (e.g., NAND flash), the upper pages tend to have more errors in general. Therefore, scanning only the upper pages can still detect problems in advance and further reduce scan time of a memory block.

Figure 8:
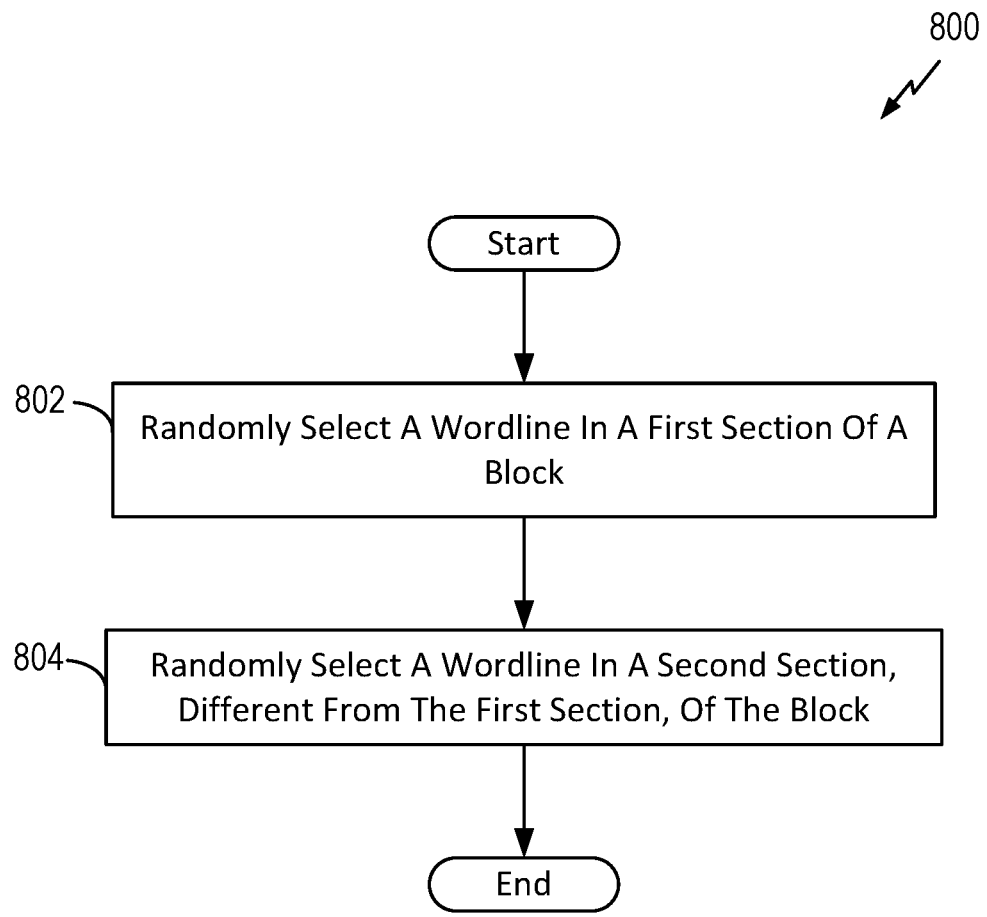
FIG. 8 is a flow chart illustrating a process for randomly selecting a wordline when performing a BGMS on a memory block in accordance with one embodiment of the disclosure.

FIG. 8 is a flow chart illustrating a process 800 for randomly selecting a wordline when performing a BGMS in accordance with an embodiment of the disclosure. This process 800 may be performed by the SSD 104 or any device in block 706 to randomly select one or more wordlines during the BGMS. At block 802, the SSD may randomly select one or more first wordlines in a first section of a block 202. At block 804, the SSD may randomly select one or more second wordlines in a second section of the block 202. For example, the block may be divided into two sections (i.e., first section and second section). The first section may include pages corresponding to the first wordline $WL_1$ through the K-th wordline $WL_K$, and the second section may include pages corresponding to the (K+1)-th wordline $WL_{k+1}$ through the n-th wordline $WL_n$. That is the first section and the second section have completely different wordlines. In one embodiment of the disclosure, the first section may have more wordlines than that of the second section. In one embodiment of the disclosure, the second section may have more wordlines than that of the first section. In one embodiment of the disclosure, the first and second sections may have an equal number of wordlines. In one embodiment, each of the first section and the second section may include multiple non-continuous sections.

Figure 9:
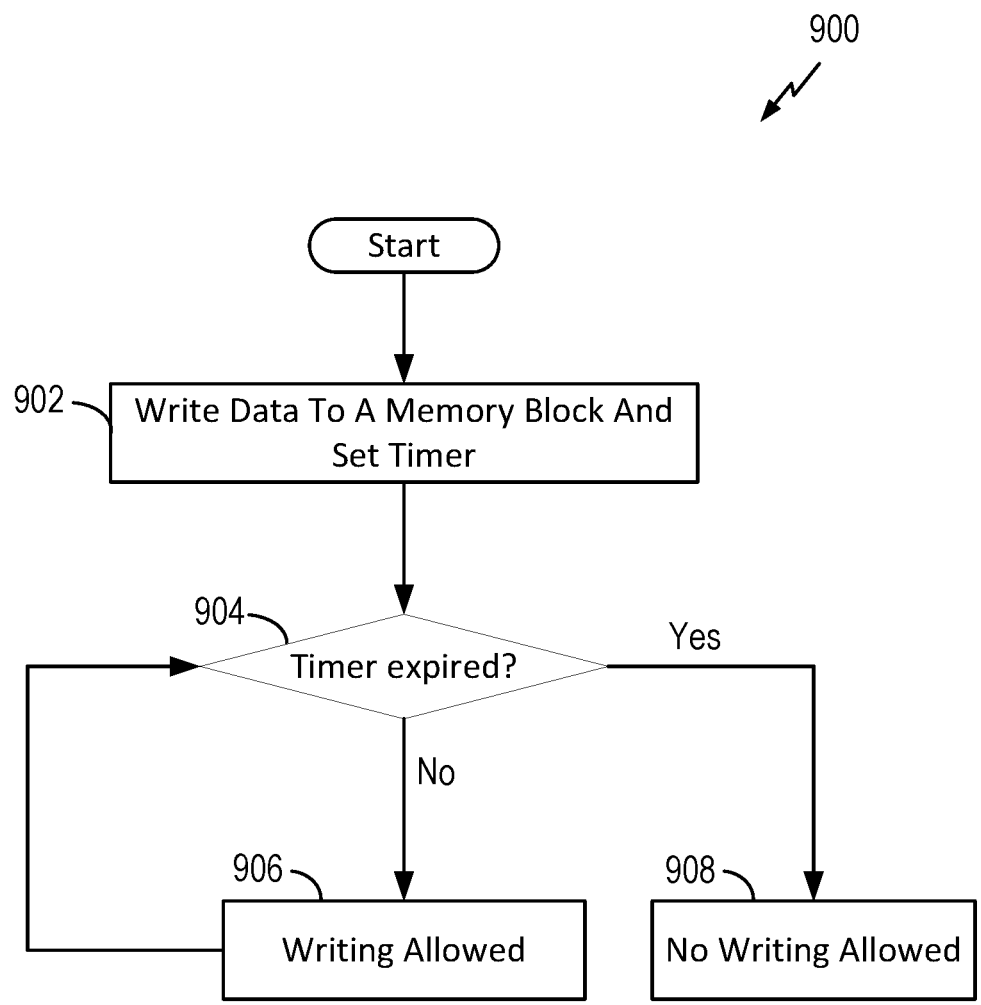
FIG. 9 is a flow chart illustrating a process for controlling a write period of a memory block in accordance with an embodiment of the disclosure.

FIG. 9 is a flow chart illustrating a process 900 for controlling a write period of a memory block in accordance with an embodiment of the disclosure. Data retention error of a memory block is affected by the data retention time and/or temperature when data is written to the block. Data retention time is a time period since certain data is written to a page. Therefore, the above-described BGMS processes may be more effective in detecting potential data retention error if the pages of a same block are written to in similar conditions. For example, if the pages of a block can only be written to within a relatively short period of time, the probability that data retention errors occur among these pages will be similar. It is because the data will have similar date retention time, and the temperature when data is written to the block will be similar among the pages.

At block 902, an SSD 104 may write data to a memory block 200 at a certain point in time (e.g., a first time point) and start a timer 114. At this instance, it may be assumed that all the pages of this block are available for writing. At decision block 904, the SSD determines whether the timer has expired or not. In one example, the timer may be set to expire in five minutes or any predetermined time period. If it is determined that the timer has not expired, the SSD may write more date to the memory block at block 906; otherwise, writing to the memory block is not allowed or prohibited at block 908 until the timer is reset. The timer may be reset when the SSD performs a garbage collection operation. Garbage collection is a process that removes data from a page that is no longer needed. The SSD may perform garbage collection periodically or on-demand by the host. In a flash memory, data is written in units of pages. When the data in some pages of a block are no longer needed or stale, the pages with good data in that block may be read and rewritten into another previously erased empty block. Then the block with the stale pages may be erased to free those stale pages for storing new data. This process is commonly known as garbage collection or the like.

While the above description contains many specific embodiments of the invention, these should not be construed as limitations on the scope of the invention, but rather as examples of specific embodiments thereof. Accordingly, the scope of the invention should be determined not by the embodiments illustrated, but by the appended claims and their equivalents.

The various features and processes described above may be used independently of one another, or may be combined in various ways. All possible combinations and sub-combinations are intended to fall within the scope of this disclosure. In addition, certain method, event, state or process blocks may be omitted in some implementations. The methods and processes described herein are also not limited to any particular sequence, and the blocks or states relating thereto can be performed in other sequences that are appropriate. For example, described tasks or events may be performed in an order other than that specifically disclosed, or multiple may be combined in a single block or state. The example tasks or events may be performed in serial, in parallel, or in some other suitable manner Tasks or events may be added to or removed from the disclosed example embodiments. The example systems and components described herein may be configured differently than described. For example, elements may be added to, removed from, or rearranged compared to the disclosed example embodiments.

What is claimed is:

1. A method of monitoring a non-volatile memory (NVM) using a background media scan (BGMS), comprising:
    performing the BGMS on a plurality of blocks of the NVM during a predetermined BGMS scan period, the BGMS comprising scanning a sample of pages included in each block of the plurality of blocks, wherein the scanning the sample of pages comprises scanning a first predetermined page, a second predetermined page, and a randomly selected page of a block of the plurality of blocks;
    determining a read error among the sample of pages of a block of the plurality of blocks; and
    scanning all pages of the block containing the read error.

2. The method of claim 1, wherein the scanning the randomly selected page of the block comprises:
  randomly selecting a first page of the block;
  scanning the first page of the block;
  randomly selecting a second page of the block different from the first page; and
  scanning the second page of the block.

3. The method of claim 1, wherein the scanning the randomly selected page of the block comprises:
  randomly selecting a first page in a first portion of the block; and
  randomly selecting a second page in a second portion of the block different from the first portion.

4. The method of claim 1, wherein the scanning the sample of pages comprises:
  scanning a page associated with a beginning wordline of a block of the blocks;
  scanning a page associated with an ending wordline of the block; and
  scanning a page associated with a wordline of the block arranged between the beginning wordline and the ending wordline.

5. The method of claim 1, wherein the scanning a sample of pages comprises:
  scanning only one page among a plurality of pages associated with a same wordline of each block of the plurality of blocks.

6. The method of claim 1, further comprising:
  determining a first time when data is written to a block of the plurality of blocks; and
  prohibiting writing of data to the block at a second time later than the first time by a predetermined time interval.

7. The method of claim 1, further comprising:
  increasing the number of times of performing the BGMS on the plurality of blocks in the BGMS scan period in response to determining the read error.

8. The method of claim 1, wherein the NVM comprises NAND-type flash memory.

9. The method of claim 1, wherein the NVM is included in solid state drive (SSD).

10. A solid state drive (SSD) comprising:
  a non-volatile memory (NVM); and
  a processor coupled to the NVM,
  wherein the processor is configured to:
    perform a background media scan (BGMS) on a plurality of blocks of the NVM during a predetermined BGMS scan period, the BGMS comprising scanning a sample of pages included in each block of the plurality of blocks, wherein the scanning the sample of pages comprises scanning a first predetermined page, a second predetermined page, and a randomly selected page of a block of the plurality of blocks;
    determine a read error among the sample of pages in a block of the plurality of blocks; and
    scan all pages of the block containing the read error.

11. The SSD of claim 10, wherein, in connection with scanning the randomly selected page of the block, the processor is further configured to:
  randomly select a first page of the block;
  scan the first page of the block;
  randomly select a second page of the block different from the first page; and
  scan the second page of the block.

12. The SSD of claim 10, wherein, in connection with scanning the randomly selected page of the block, the processor is further configured to:
  randomly select a first page in a first portion of the block; and
  randomly select a second page in a second portion of the block different from the first portion.

13. The SSD of claim 10, wherein, in connection with scanning a sample of pages, the processor is further configured to:
  scan a page associated with a beginning wordline of a block of the blocks;
  scan a page associated with an ending wordline of the block; and
  scan a page associated with a wordline of the block arranged between the beginning wordline and the ending wordline.

14. The SSD of claim 10, wherein, in connection with scanning a sample of pages, the processor is further configured to:
  scan only one page among a plurality of pages associated with a same wordline of each block of the plurality of blocks.

15. The SSD of claim 10, wherein the processor is further configured to:
  determine a first time when data is written to a block of the plurality of blocks; and
  prohibit writing of data to the block at a second time later than the first time by a predetermined time interval.

16. The SSD of claim 10, wherein the processor is further configured to:
  increase the number of times of performing the BGMS on the plurality of blocks in the BGMS scan period in response to determining the read error.

17. The SSD of claim 10, wherein the NVM comprises NAND-type flash memory.

* * * * *